United States Patent
Kim et al.

(10) Patent No.: US 10,636,350 B2
(45) Date of Patent: Apr. 28, 2020

(54) LIGHT EMITTING DIODE HAVING A DECREASED DRIVING VOLTAGE AND IMPROVED LUMINOUS EFFICIENCY AND DISPLAY DEVICE INCLUDING THE SAME

(71) Applicant: SAMSUNG DISPLAY CO., LTD., Yongin-si, Gyeonggi-do (KR)

(72) Inventors: Dong Chan Kim, Yongin-si (KR); Byoung Duk Lee, Yongin-si (KR); Yoon Hyeung Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/997,754

(22) Filed: Jun. 5, 2018

(65) Prior Publication Data

US 2019/0096318 A1 Mar. 28, 2019

(30) Foreign Application Priority Data

Sep. 22, 2017 (KR) .................. 10-2017-0122742

(51) Int. Cl.
 *G09G 3/32* (2016.01)
 *H01L 51/50* (2006.01)
 (Continued)

(52) U.S. Cl.
 CPC .............. *G09G 3/32* (2013.01); *C09K 11/02* (2013.01); *C09K 11/77* (2013.01); *H01L 33/06* (2013.01);
 (Continued)

(58) Field of Classification Search
 CPC ....... G09G 3/32; H01L 33/26; H01L 51/5024; H01L 33/06; H01L 51/502; C09K 11/77; C09K 11/02
 See application file for complete search history.

(56) References Cited

U.S. PATENT DOCUMENTS

2011/0291071 A1 12/2011 Kim et al.
2016/0248034 A1* 8/2016 Kim .................. H01L 51/5072
(Continued)

FOREIGN PATENT DOCUMENTS

| EP | 2479811 A1 | 7/2012 |
| KR | 10-1331304 B1 | 11/2013 |
| KR | 10-2017-0049766 A | 5/2017 |
| WO | WO 2010/110554 A2 | 9/2010 |
| WO | WO 2017/043084 A1 | 3/2017 |

OTHER PUBLICATIONS

Zhang, L. et al. Ultra-bright and highly efficient inorganic based perovskite light-emitting diodes. Nat. Commun. 8, 15640 doi: 10.1038/ncomms15640 (Year: 2017).*

(Continued)

*Primary Examiner* — Tracie Y Green

(74) *Attorney, Agent, or Firm* — Lewis Roca Rothgerber Christie LLP

(57) ABSTRACT

A light emitting diode and a display device, the light emitting diode including a first electrode; a second electrode overlapping the first electrode; and an emission layer positioned between the first electrode and the second electrode, wherein the emission layer includes a first material, the first material including an alkali metal halide, an alkaline earth metal halide, a transition metal halide, an alkali metal chalcogenide, or an alkaline earth metal chalcogenide, and a second material, the second material including a lanthanide metal or a compound of a lanthanide metal.

23 Claims, 4 Drawing Sheets

(51) Int. Cl.
H01L 51/52 (2006.01)
H01L 33/26 (2010.01)
H01L 33/36 (2010.01)
H01L 33/06 (2010.01)
C09K 11/02 (2006.01)
C09K 11/77 (2006.01)

(52) U.S. Cl.
CPC .............. *H01L 33/26* (2013.01); *H01L 33/36* (2013.01); *H01L 51/502* (2013.01); *H01L 51/5024* (2013.01); *H01L 51/5056* (2013.01); *H01L 51/5072* (2013.01); *H01L 51/5092* (2013.01); *H01L 51/5218* (2013.01); *H01L 51/5221* (2013.01)

(56) References Cited

U.S. PATENT DOCUMENTS

| | | | | |
|---|---|---|---|---|
| 2016/0285035 | A1* | 9/2016 | Kim | H01L 51/5215 |
| 2017/0222162 | A1* | 8/2017 | Lee | H01L 51/0077 |
| 2017/0358759 | A1* | 12/2017 | Lee | H01L 31/032 |
| 2019/0058135 | A1* | 2/2019 | Ma | H01L 51/0077 |

OTHER PUBLICATIONS

Shi et al., Lead-Free Organic-Inorganic Hybrid Perovskites for Photovoltaic Applications:Recent Advances and Perspectives, Adv. Mater. 2017, 29, 1605005 (Year: 2017).*

Cho et al.( High-Efficiency Solution-Processed Inorganic Metal Halide PerovskitenLight-Emitting Diodes. Adv. Mater.29, 8, 1700579, pp. 1-8) (Year: 2017).*

H. Ramanantoanina, et al., "Prospecting Lighting Applications with Ligand Field Tools and Density Functional Theory: A First-Principles Account of the $4f^7$—$4f^65d^1$ Luminescence of $CsMgBr_3:Eu^{2+}$", American Chemical Society, 54, pp. 8319-8326 (2015).

Y.H. Kim, et al., "Metal halide perovskite light emitters", PNAS, vol. 113, No. 42, pp. 11694-11702 (2016).

M. Suta, et al., "Photoluminescence properties of $Yb^{2+}$ ions doped in the perovskites $CsCaX_3$ and $CsSrX_3$ (X=Cl, Br, and I)—a comparative study", Phys. Chem. Chem. Phys., 18, pp. 13196-13208 (2016).

J. Albero, et al., "Luminescence control in hybrid perovskites and their applications", J. Mater. Chem., 5, pp. 4098-4110 (2017).

European Search Report, dated Nov. 2, 2018, for corresponding EP 18194483.6.

M.S. Alekhin et al., "Luminescence and spectroscopic properties of $Sm^{2+}$ and $Er^{3+}$ doped $SrI_2$", Journal of Luminescence, 167 (2015), 347-351.

N.J. Cherepy et al., "Performance of Europium-Doped Strontium Iodide, Transparent Ceramics and Bismuth-loaded Polymer Scintillators", SPIE, 8142 (2011), 1-8.

P. Dorenbos, "Energy of the first $4f^7 \rightarrow 4f^65d$ transition of $Eu^{2+}$ in inorganic compounds", Journal of Luminescence, 104 (2003), 239-260.

E. Rowe, "High-Performance Doped Strontium Iodide Crystal Growth Using a Modified Bridgman Method", Virginia Commonwealth University, 2014.

* cited by examiner

LIGHT EMITTING DIODE HAVING A DECREASED DRIVING VOLTAGE AND IMPROVED LUMINOUS EFFICIENCY AND DISPLAY DEVICE INCLUDING THE SAME

CROSS-REFERENCE TO RELATED APPLICATION

Korean Patent Application No. 10-2017-0122742 filed on Sep. 22, 2017, in the Korean Intellectual Property Office, and entitled: "Light Emitting Diode and Display Device Including the Same," is incorporated by reference herein in its entirety.

BACKGROUND

1. Field

Embodiments relate to a light emitting diode and a display device including the same.

2. Description of the Related Art

A light emitting diode is an element in which holes supplied from an anode and electrons supplied from a cathode are combined in an emission layer formed between the anode and the cathode to form excitons, and light is emitted while the excitons are stabilized.

The light emitting diode has several advantages such as a wide viewing angle, a fast response speed, a thin thickness, and lower power consumption such that the light emitting diode is widely applied to various electrical and electronic devices such as a television, a monitor, a mobile phone, etc.

The above information disclosed in this Background section is only for enhancement of understanding of the background and therefore it may contain information that does not form the prior art that is already known in this country to a person of ordinary skill in the art.

SUMMARY

Embodiments are directed to a light emitting diode and a display device including the same.

The embodiments may be realized by providing a light emitting diode including a first electrode; a second electrode overlapping the first electrode; and an emission layer positioned between the first electrode and the second electrode, wherein the emission layer includes a first material, the first material including an alkali metal halide, an alkaline earth metal halide, a transition metal halide, an alkali metal chalcogenide, or an alkaline earth metal chalcogenide, and a second material, the second material including a lanthanide metal or a compound of a lanthanide metal.

The first material may include LiI, NaI, KI, RbI, CsI, FrI, $BeI_2$, $MgI_2$, $CaI_2$, $SrI_2$, $BaI_2$, $RaI_2$, LiCl, NaCl, KCl, RbCl, CsCl, FrCl, LiBr, NaBr, KBr, RbBr, CsBr, FrBr, $MgCl_2$, $CaCl_2$, $BaCl_2$, $SrCl_2$, $RaCl_2$, $MgBr_2$, $CaBr_2$, $BaBr_2$, $SrBr_2$, $RaBr_2$, $MgClBr$, $CaClBr$, $BaClBr$, $SrClBr$, $RaClBr$, $MgClI$, $CaClI$, $BaClI$, $SrChI$, $RaCH$, $MgBrI$, $CaBrI$, $BaBrI$, $SrBrI$, $RaBrI$, $Li_2S$, $Na_2S$, $K_2S$, $Rb_2S$, $Cs_2S$, $Fr_2S$, $Li_2Se$, $Na_2Se$, $K_2Se$, $Rb_2Se$, $Cs_2Se$, $Fr_2Se$, $Li_2Te$, $Na_2Te$, $K_2Te$, $Rb_2Te$, $Cs_2Te$, $Fr_2Te$, MgS, CaS, BaS, SrS, RaS, MgSe, CaSe, BaSe, SrSe, RaSe, MgTe, CaTe, BaTe, SrTe, or RaTe.

The second material may include the compound of the lanthanide metal, and the compound of the lanthanide metal is a compound that may include La, Ce, Pr, Nd, Pm, Sm, Eu, Gd, Tb, Dy, Ho, Er, Tm, Yb, or Lu, and O, S, Se, Te, F, Cl, Br, or I.

A content ratio of the first material to the second material of the emission layer may be 5:5 to 9.9:0.1.

The emission layer may include a third material formed by reacting the first material and the second material.

The third material may be denoted by $A_m B_n C_z$, A may be an alkali metal, B may be a lanthanide metal or an alkaline earth metal, C may be a halogen group element, and each of m, n, and z may be an integer of 1 to 9.

The emission layer may include CsI, RbI, KI, NaI, $CaI_2$, or $SrI_2$, and Eu, Yb, or Sm, and a central wavelength emitted from the emission layer may be 410 nm to 800 nm.

The emission layer may not include cadmium or lead.

The light emitting diode may further include a hole transporting layer positioned between the first electrode and the emission layer, wherein the hole transporting layer includes an alkali metal halide or an alkaline earth metal halide.

The light emitting diode may further include an electron transporting layer positioned between the second electrode and the emission layer, wherein the electron transporting layer includes an alkali metal halide or an alkaline earth metal halide, and a lanthanide metal.

The embodiments may be realized by providing a light emitting diode including a first electrode; a second electrode overlapping the first electrode; and an emission layer positioned between the first electrode and the second electrode, wherein the emission layer includes a host and a dopant, the host includes an alkali metal halide, an alkaline earth metal halide, a transition metal halide, an alkali metal chalcogenide, or an alkaline earth metal chalcogenide, and the dopant includes a lanthanide metal or a compound of a lanthanide metal.

A content ratio of the host to the dopant of the emission layer may be 5:5 to 9.9:0.1.

The host may include LiI, NaI, KI, RbI, CsI, FrI, $BeI_2$, $MgI_2$, $CaI_2$, $SrI_2$, $BaI_2$, $RaI_2$, LiCl, NaCl, KCl, RbCl, CsCl, FrCl, LiBr, NaBr, KBr, RbBr, CsBr, FrBr, $MgCl_2$, $CaCl_2$, $BaCl_2$, $SrCl_2$, $RaCl_2$, $MgBr_2$, $CaBr_2$, $BaBr_2$, $SrBr_2$, $RaBr_2$, $MgClBr$, $CaClBr$, $BaClBr$, $SrClBr$, $RaClBr$, $MgClI$, $CaClI$, $BaClI$, $SrClI$, $RaClI$, $MgBrI$, $CaBrI$, $BaBrI$, $SrBrI$, $RaBrI$, $Li_2S$, $Na_2S$, $K_2S$, $Rb_2S$, $Cs_2S$, $Fr_2S$, $Li_2Se$, $Na_2Se$, $K_2Se$, $Rb_2Se$, $Cs_2Se$, $Fr_2Se$, $Li_2Te$, $Na_2Te$, $K_2Te$, $Rb_2Te$, $Cs_2Te$, $Fr_2Te$, MgS, CaS, BaS, SrS, RaS, MgSe, CaSe, BaSe, SrSe, RaSe, MgTe, CaTe, BaTe, SrTe, or RaTe.

The dopant may include the compound of the lanthanide metal, and the compound of the lanthanide metal may be a compound that includes La, Ce, Pr, Nd, Pm, Sm, Eu, Gd, Tb, Dy, Ho, Er, Tm, Yb, or Lu, and O, S, Se, Te, F, Cl, Br, or I.

The host may include CsI, RbI, KI, NaI, $CaI_2$, or $SrI_2$, the dopant may include Eu, Yb, or Sm, and a central wavelength emitted from the emission layer may be 410 nm to 800 nm.

The embodiments may be realized by providing a display device including a substrate; a thin film transistor positioned on the substrate; and a light emitting diode connected to the thin film transistor, wherein the light emitting diode includes a first electrode, a second electrode overlapping the first electrode, and an emission layer positioned between the first electrode and the second electrode, the emission layer includes an alkali metal halide, an alkaline earth metal halide, a transition metal halide, an alkali metal chalcogenide, or an alkaline earth metal chalcogenide, and a lanthanide metal or a compound of a lanthanide metal, and the emission layer does not include an organic material.

The emission layer may include the alkali metal halide or the alkaline earth metal halide, and the alkali metal halide or the alkaline earth metal halide may include LiI, NaI, KI, RbI, CsI, FrI, BeI$_2$, MgI$_2$, CaI$_2$, SrI$_2$, BaI$_2$, RaI$_2$, LiCl, NaCl, KCl, RbCl, CsCl, FrCl, LiBr, NaBr, KBr, RbBr, CsBr, FrBr, MgCl$_2$, CaCl$_2$, BaCl$_2$, SrCl$_2$, RaCl$_2$, MgBr$_2$, CaBr$_2$, BaBr$_2$, SrBr$_2$, RaBr$_2$, MgClBr, CaClBr, BaClBr, SrClBr, RaClBr, MgClI, CaClI, BaClI, SrChI, RaClI, MgBrI, CaBrI, BaBrI, SrBrI, RaBrI, Li$_2$S, Na$_2$S, K$_2$S, Rb$_2$S, Cs$_2$S, Fr$_2$S, Li$_2$Se, Na$_2$Se, K$_2$Se, Rb$_2$Se, Cs$_2$Se, Fr$_2$Se, Li$_2$Te, Na$_2$Te, K$_2$Te, Rb$_2$Te, Cs$_2$Te, Fr$_2$Te, MgS, CaS, BaS, SrS, RaS, MgSe, CaSe, BaSe, SrSe, RaSe, MgTe, CaTe, BaTe, SrTe, or RaTe.

The emission layer may include the compound of the lanthanide metal, and the compound of the lanthanide metal may be a compound that includes La, Ce, Pr, Nd, Pm, Sm, Eu, Gd, Tb, Dy, Ho, Er, Tm, Yb, or Lu, and O, S, Se, Te, F, Cl, Br, or I.

The alkali metal halide, the alkaline earth metal halide, the transition metal halide, the alkali metal chalcogenide, or the alkaline earth metal chalcogenide may be a host of the emission layer, the lanthanide metal or the compound of a lanthanide metal may be a dopant of the emission layer, the host may include CsI, RbI, KI, NaI, CaI$_2$, or SrI$_2$, the dopant may include Eu, Yb, or Sm, and a central wavelength emitted from the emission layer may be 410 nm to 800 nm.

A content ratio of the alkali metal halide, the alkaline earth metal halide, the transition metal halide, the alkali metal chalcogenide, and the alkaline or metal chalcogenide to the lanthanide metal or the compound of a lanthanide metal may be 5:5 to 9.9:0.1.

The alkali metal halide, the alkaline earth metal halide, the transition metal halide, the alkali metal chalcogenide, or the alkaline earth metal chalcogenide may be a host of the emission layer, and the lanthanide metal or the compound of a lanthanide metal may be a dopant of the emission layer.

The emission layer may include a material denoted by $A_mB_nC_z$, A may be an alkali metal, B may be a lanthanide metal or an alkaline earth metal, C may be a halogen group element, and each of m, n, and z may be an integer of 1 to 9.

The emission layer may not include cadmium or lead.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
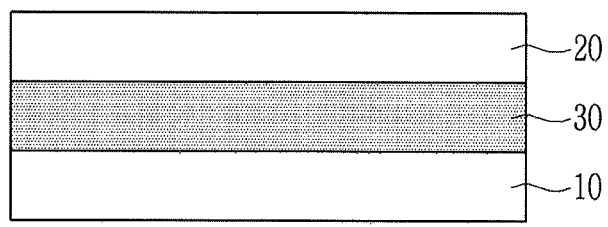
FIG. 1 illustrates a cross-sectional view of a light emitting diode according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., and has the same meaning as "and/or."

To clearly describe the embodiments, portions that do not relate to the description may be omitted.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "includes," "including," "comprises" or "comprising" will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

FIG. 1 illustrates a cross-sectional view of a light emitting diode according to an exemplary embodiment. Referring to FIG. 1, a light emitting diode according to an exemplary embodiment may include a first electrode 10, a second electrode 20 overlapping the first electrode 10, and an emission layer 30 positioned between the first electrode 10 and the second electrode 20.

The emission layer 30 of the light emitting diode according to the exemplary embodiment may include a first material (including e.g., an alkali metal halide, an alkaline earth metal halide, a transition metal halide, an alkali metal chalcogenide, or an alkaline earth metal chalcogenide), and a second material (including, e.g., a lanthanide metal or a compound of a lanthanide metal). In an implementation, the emission layer 30 may include the first material as a host of the emission layer 30, and the second material as a dopant of the emission layer 30. A specific material and a light emitting mechanism of the emission layer 30 will be described below. In an implementation, the emission layer 30 may not include Cd and Pb. In an implementation, the emission layer 30 may be free of added Cd and Pb. In an implementation, the emission layer 30 may not include an organic material. In an implementation, the emission layer 30 may be essentially free of an organic material. In an implementation, the emission layer 30 may be free of an added organic material. In an implementation, the emission layer 30 may partially include an organic material.

In an implementation, the first electrode 10 may be an anode, and the second electrode 20 may be a cathode. The first electrode 10 corresponding to the anode is an electrode for injecting holes into the emission layer 30 when supplied with a current, and may include a material having a high work function. The second electrode 20 is an electrode for injecting electrons into the emission layer 30 when supplied with a current, and may include a material having a low work function. In an implementation, the first electrode 10 may be a cathode and the second electrode 20 may be an anode.

The first electrode 10 or the second electrode 20 may include, e.g., a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or combinations thereof, calcium (Ca), ytterbium (Yb), aluminum (Al), silver (Ag), magnesium (Mg), samarium (Sm), titanium (Ti), gold (Au), or alloys thereof, graphene, carbon nanotubes, or a conductive polymer such as PEDOT:PSS. In an implementation, the first electrode 10 and the second electrode 20 may be formed to have a two or more layered stack structure.

In an implementation, the first electrode 10 may be a reflective electrode having an ITO/Ag/ITO structure, and the second electrode 20 may be a transflective electrode including AgMg. Light emitted from the emission layer 30 may be reflected by the first electrode 10 which is the reflective electrode, and may be resonated and amplified between the second electrode 20 which is the transflective electrode and the first electrode 10. The resonated light may be reflected by the first electrode 10 and is emitted from the second electrode 20.

In an implementation, the second electrode 20 may include an alloy made of two or more of silver (Ag), magnesium (Mg), aluminum (Al), and ytterbium (Yb). For example, the second electrode 20 may include AgMg, and in this case, a content of Ag of the second electrode 20 may be more than that of Mg thereof. In an implementation, the content of Mg may be about 10 vol %. A thickness of the second electrode 20 may be in a range of 80 to 150 angstroms. In an implementation, the second electrode 20 may include AgYb, and in this case, a content of Yb may be about 10 vol %.

In an implementation, the first electrode 10 and the second electrode 20 may be formed by, e.g., a sputtering method, a vapor phase deposition method, an ion beam deposition method, an electron beam deposition method, or the like.

In an implementation, the emission layer 30 may include a host of the emission layer and a light emitting dopant.

In an implementation, the host of the emission layer may include, e.g., an alkali metal halide, an alkaline earth metal halide, a transition metal halide, an alkali metal chalcogenide, or an alkaline earth metal chalcogenide. In an implementation, the alkali metal may include, e.g., Li, Na, K, Rb, Cs, or Fr. In an implementation, the alkaline earth metal may include, e.g., Be, Mg, Ca, Sr, Ba, and Ra. In an implementation, the halide may include, e.g., F, Cl, Br, or I. In an implementation, the host of the emission layer 30 may include e.g., LiI, NaI, KI, RbI, CsI, FrI, $BeI_2$, $MgI_2$, $CaI_2$, $SrI_2$, $BaI_2$, $RaI_2$, LiCl, NaCl, KCl, RbCl, CsCl, FrCl, LiBr, NaBr, KBr, RbBr, CsBr, FrBr, $MgCl_2$, $CaCl_2$, $BaCl_2$, $SrCl_2$, $RaCl_2$, $MgBr_2$, $CaBr_2$, $BaBr_2$, $SrBr_2$, $RaBr_2$, MgClBr, CaClBr, BaClBr, SrClBr, RaClBr, MgClI, CaClI, BaClI, SrClI, RaClI, MgBrI, CaBrI, BaBrI, SrBrI, RaBrI, $Li_2S$, $Na_2S$, $K_2S$, $Rb_2S$, $Cs_2S$, $Fr_2S$, $Li_2Se$, $Na_2Se$, $K_2Se$, $Rb_2Se$, $Cs_2Se$, $Fr_2Se$, $Li_2Te$, $Na_2Te$, $K_2Te$, $Rb_2Te$, $Cs_2Te$, $Fr_2Te$, MgS, CaS, BaS, SrS, RaS, MgSe, CaSe, BaSe, SrSe, RaSe, MgTe, CaTe, BaTe, SrTe, or RaTe. In an implementation, when the host of the emission layer 30 is an iodide of an alkali metal or an iodide of an alkaline earth metal, an iodine compound may have low dissociation energy, so that it may be easily substituted with a lanthanide metal as a dopant.

In an implementation, the dopant of the emission layer may include, e.g., a lanthanide metal or a compound of a lanthanide metal.

In an implementation, the lanthanide metal may include, e.g., La, Ce, Pr, Nd, Pm, Sm, Eu, Gd, Tb, Dy, Ho, Er, Tm, Yb, or Lu. In an implementation, the compound of a lanthanide metal may be a compound of, e.g., La, Ce, Pr, Nd, Pm, Sm, Eu, Gd, Tb, Dy, Ho, Er, Tm, Yb, or Lu with, e.g., O, S, Se, Te, F, Cl, Br, or I.

In an implementation, a content ratio of the host to the dopant of the emission layer may be 5:5 to 9.9:0.1. A wavelength of light emitted from the emission layer may be controlled according to the content ratio. For example, a different color may be emitted depending on the content ratio even if the host and the dopant included in the emission layer are the same.

In an implementation, the content ratio may be a volume ratio. For example, the volume ratio described herein may be measured based on a volume of a target in a thermal evaporation process for forming the emission layer. For example, the volume ratio may be acquired by measuring volume reduction of one target of an alkali metal halide, an alkaline earth metal halide, a transition metal halide, an alkali metal chalcogenide, or an alkaline earth metal chalcogenide, and a compound target of a lanthanide metal or lanthanide metal, which are used in a thermal evaporation process for forming the emission layer.

In an implementation, the emission layer 30 of the light emitting diode may further include a third material formed by reacting the host and the dopant in a thermal evaporation process. The bonding between the host and the dopant may be broken in the thermal evaporation process, and then each of the broken host and dopant may be re-reacted and re-bonded with a neighboring host or dopant, so that the third material may be formed.

In an implementation, the third material may be denoted by, e.g., $A_mB_nC_z$. For example, the A may be an alkali metal or an alkaline earth metal, the B may be a lanthanide metal or an alkali earth metal, the C may be a halogen group element, and m, n, and z may each independently be an integer of 1 to 9.

Figure 2:
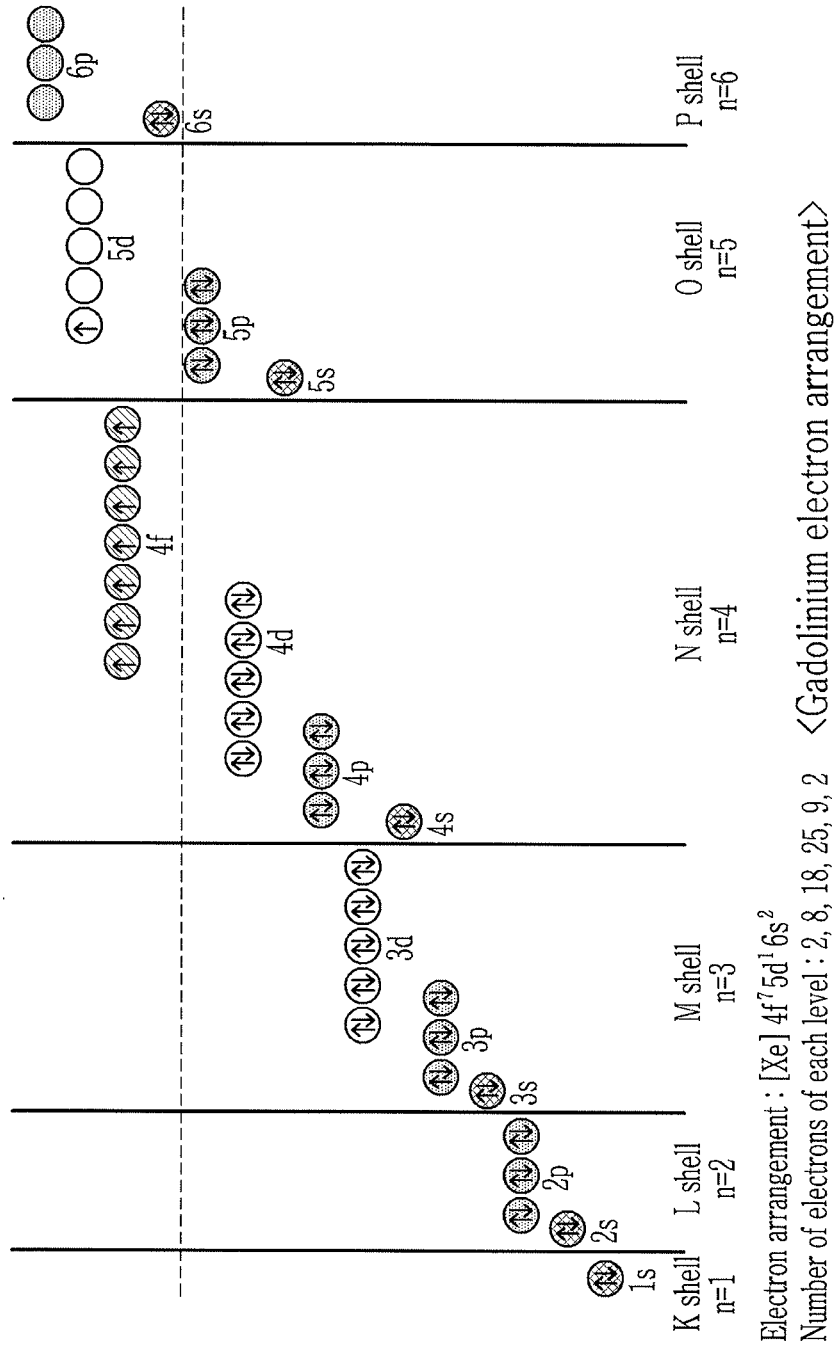
FIG. 2 illustrates arrangement of electrons of gadolinium, which is a lanthanide metal.

FIG. 2 illustrates an arrangement of electrons of gadolinium, which is a lanthanide metal.

As can be seen in FIG. 2, in the lanthanide metal, light emitting characteristics may be variously determined by the 4f-5d electron transition generated between the 4f-level of the N-electron shell at n=4 and the 5f-level of the O-electron shell at n=5. According to the light emitting mechanism, electrons excited in the host material may relax along the conduction band to a ground state at 4f and then emit light as they transition to 5d, and as electrons transferred to the electron transport layer are down-converted to a level in which spin-orbitals are coupled, they transition and emit light. Accordingly, it is possible to realize a light emitting characteristic of fluorescence or phosphorescence.

As such, by controlling kinds and contents of the host and dopant materials of the emission layer 30, it is possible to emit various colors. In an implementation, when the emission layer 30 includes at least one of CsI, RbI, $CaI_2$, and $SrI_2$ as the host and includes Eu as the dopant, a central wavelength of light emitted from the emission layer may be about 420 nm to 470 nm (e.g., emitted light of a highest intensity may be about 420 nm to 470 nm). For example, the emission layer 30 may emit a blue color. In an implementation, the emission layer 30 may emit various kinds of visible light depending on a kind and a content of the host material and the dopant material.

In an implementation, the emission layer 30 may not include harmful materials, e.g., cadmium (Cd) or lead (Pb). In an implementation, the emission layer 30 may not include an organic material. In an implementation, the emission layer 30 may include some of an organic material. In an implementation, a main material of the emission layer 30 may be an inorganic material.

In some emission layers including an organic material, a surface light emitting display may be realized by thermal evaporation of the organic material by thermal evaporation. The organic material thereof may easily deteriorates by high temperature and moisture. In addition, red or green light may stably emit phosphorescence. With blue light (having a relatively short wavelength), stability of phosphorescence thereof may deteriorate and it may not be easy to form a blue light emitting diode with high efficiency.

In addition, in a case of an inorganic light emitting diode including InGaN as an emission layer, it may be grown to have a single crystal without a lattice defect by a single crystal substrate such as a sapphire or silicon substrate, and there may be a restriction in selecting a substrate material. Further, it may be possible to manufacture only a point light emitting diode for illumination because it may have to grow into a single crystal, and a chemical vapor deposition (CVD) process may be required, and a temperature of the substrate may be high.

In a case of a light emitting diode including a quantum dot as an emission layer, there may not be a material capable of displaying blue color except for an environmentally harmful Cd-based quantum dot. In addition, the light emitting diode including the quantum dot as the emission layer may have issues in mass production because it may use a solution process and a printing process in a manufacturing process thereof.

The light emitting diode including a first material (corresponding to an alkali metal halide, an alkaline earth metal halide, a transition metal halide, an alkali metal chalcogenide, or an alkaline earth metal chalcogenide) as a dopant, and a second material (corresponding to a lanthanide metal or a compound of a lanthanide metal) as a host, may be less susceptible to temperature and moisture than the organic material because it is manufactured with the inorganic material. In addition, it may not necessarily require monocrystalline growth, there is no restriction on the substrate, and surface emission may be possible. In addition, it may be manufactured by a vacuum process method such as thermal vapor deposition method, and it is easier to apply the mass production than when the emission layer is formed using the solution process.

Further, by variously selecting the host and dopant materials of the emission layer or controlling the contents of the host and dopant materials, it is possible to change the color of emitting light. For example, when CsI, RbI, CaI$_2$, or SrI$_2$ is used as a host and Eu is used as a dopant, blue light may be stably emitted.

Figure 3:
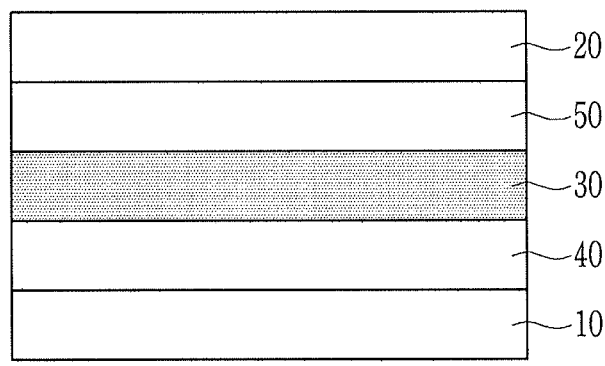
FIG. 3 illustrates a cross-sectional view of a light emitting diode according to another exemplary embodiment.

Hereinafter, a light emitting diode according to another exemplary embodiment will be described with reference to FIG. 3. As shown in FIG. 3, the light emitting diode according to the exemplary embodiment of FIG. 3 is substantially similar to the light emitting diode according to the exemplary embodiment of FIG. 1. A repeated detailed description for the same constituent elements may be omitted, and differences will be mainly described.

Referring to FIG. 3, the light emitting diode according to the present exemplary embodiment may further include a hole transporting layer 40 positioned between the first electrode 10 and the emission layer 30 and an electron transporting layer 50 positioned between the second electrode 20 and the emission layer 30.

The hole transporting layer 40 may include at least one of a hole transporting layer and a hole injection layer. In an implementation, the hole injection layer may be positioned close to the first electrode 10, and the hole transporting layer may be positioned close to the emission layer 30.

The electron transporting layer 50 may include at least one of an electron transporting layer and an electron injection layer. In an implementation, the electron injection layer may be positioned close to the second electrode 20, and the electron transporting layer may be positioned close to the emission layer 30.

In an implementation, the hole transporting layer 40 may include an alkali metal halide or an alkaline earth metal halide. In an implementation, the hole transporting layer 40 may include CuI. In an implementation, the hole injection layer may include CuI, and a thickness of the hole injection layer may be in a range of 10 to 50 angstroms.

In an implementation, the electron transporting layer 50 may include an alkali metal halide or an alkaline earth metal, and a lanthanide metal. In an implementation, the electron transporting layer 50 may include Yb and RbI. In an implementation, the electron injection layer may include Yb and RbI, and in this case, a content of RbI with respect to Yb may be about 10 vol %. A thickness of the electron injection layer may be in a range of 15 to 25 angstroms.

In an implementation, in the light emitting diode, all of the electron transporting layer 50, the hole transporting layer 40, and the emission layer 30 may include inorganic materials, and it is possible to lower contact resistance at an interface and to increase efficiency of transporting electrons and holes, thereby increasing luminous efficiency.

In an implementation, the emission layer may not include the organic material or includes only some thereof, and may not include harmful materials such as Cd and Pb, and there may be no deterioration of the organic material and it may not cause environmental pollution.

In an implementation, the hole transporting layer 40 and the electron transporting layer 50 may include an organic material.

In an implementation, the hole transporting layer 40 may include, e.g., m-MTDATA, TDATA, 2-TNATA, NPB(NPD), β-NPB, TPD, Spiro-TPD, Spiro-NPB, methylated-NPB, TAPC, HMTPD, TCTA (4,4',4"-tris(N-carbazolyl)triphenylamine, PANI/DBSA (polyaniline/dodecylbenzenesulfonic acid), PEDOT/PSS (poly(3,4-ethylenedioxythiophene)/poly(4-styrenesulfonate)), PANI/CSA (polyaniline/camphor sulfonic acid), PANI/PSS (polyaniline/poly(4-styrenesulfonate)), a compound represented by the following Chemical Formula 201, or a compound represented by the following Chemical Formula 202.

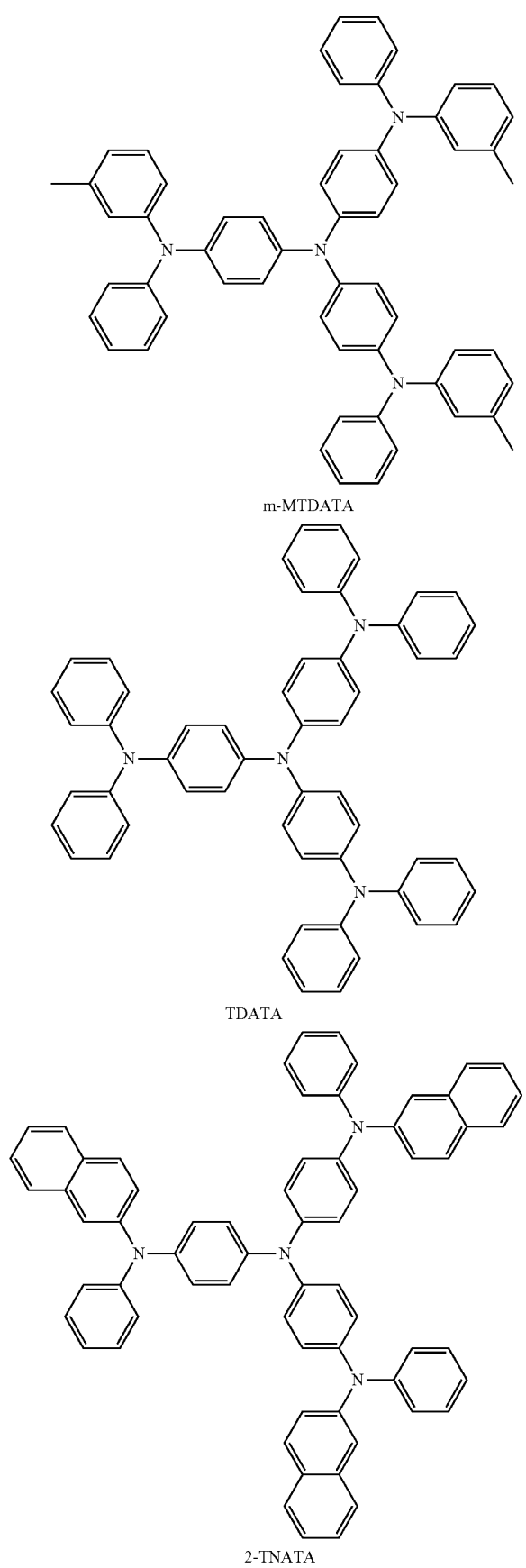
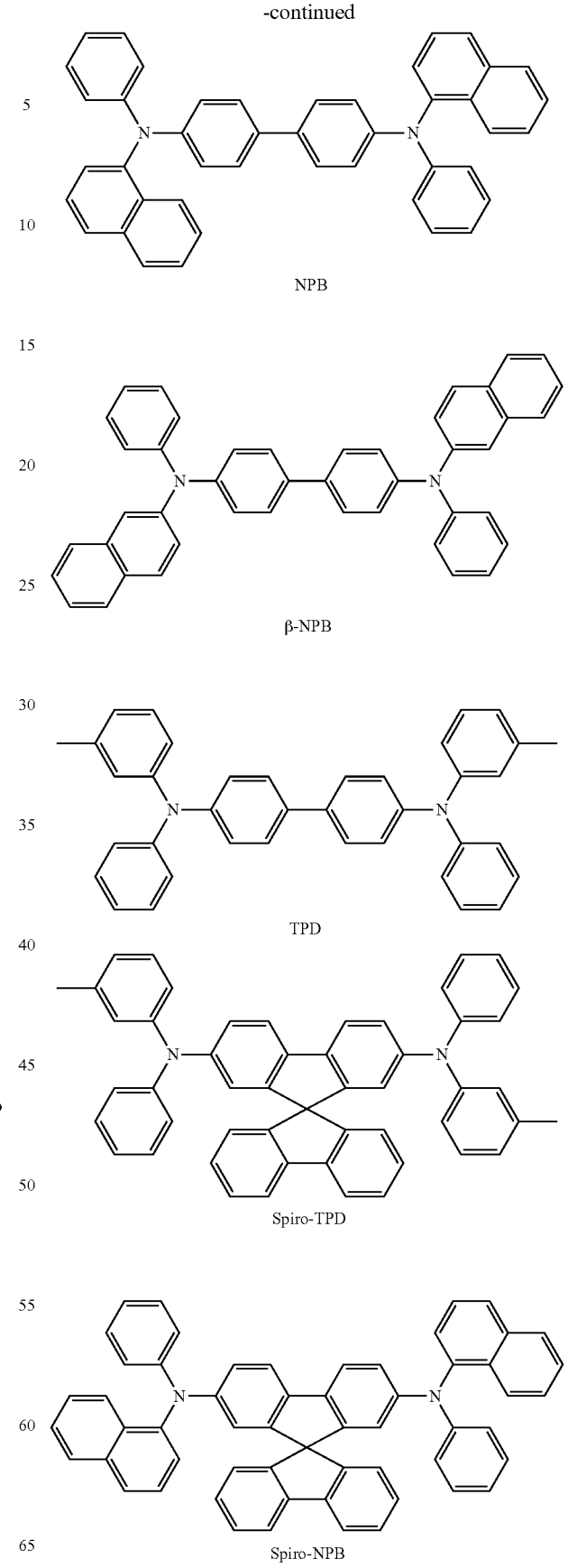

-continued

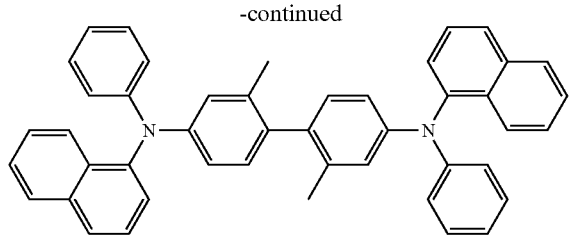

methylated NPB

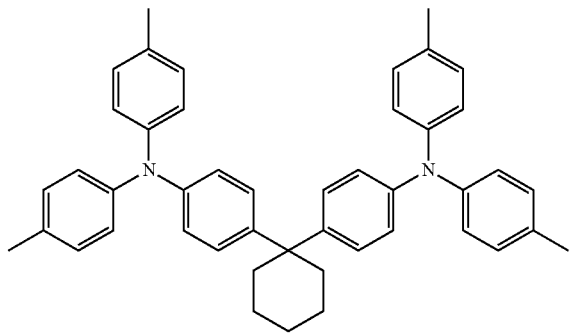

TAPC

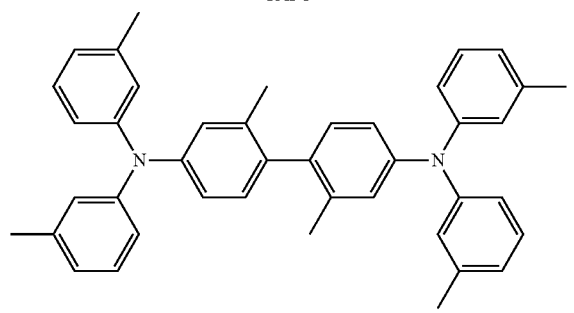

HMTPD

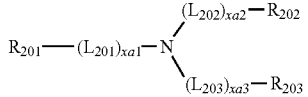

<Chemical Formula 201>

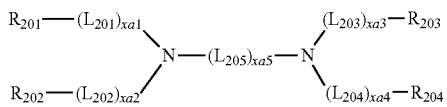

<Chemical Formula 202>

In Chemical Formulae 201 and 202, each of $L_{201}$ to $L_{204}$ may be independently selected from a substituted or unsubstituted $C_3$-$C_{10}$ cycloalkylene group, a substituted or unsubstituted C heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group; $L_{205}$ may be selected from *—O—*', *—S—*', and *—N $Q_{201}$-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene, a substituted or unsubstituted $C_1$-$C_{10}$ heterocycloalkenylene, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group; each of xa1 to xa4 may be independently selected from integers of 0 to 3; xa5 may be selected from integers of 1 to 10; and each of $R_{201}$ to $R_{204}$ and $Q_{201}$ may be independently selected from a substituted or unsubstituted $C_3$-$C_{10}$ cycloalkyl, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group.

In an implementation, the electron transporting layer 50 may include a compound represented by Chemical Formula 601.

$$[Ar_{601}]_{xe11}\text{-}[L_{601xe1}\text{-}R_{601}]_{xe21}$$ <Chemical Formula 601>

$Ar_{601}$ of Chemical Formula 601 is a substituted or unsubstituted $C_5$-$C_{60}$ carbocyclic group or a substituted or unsubstituted $C_1$-$C_{60}$ heterocyclic group; xe11 is 1, 2 or 3; $L_{601}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group; xe1 is selected from integers of 0 to 5; $8_{601}$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic heterocondensed polycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$); each of $Q_{601}$ to $Q_{603}$ is independently a $C_1$-$C_{10}$ alkyl group, a $C_1$-$C_{10}$ alkoxy group, a phenyl group, a biphenyl group, a terphenyl group, or a naphthyl group; and xe21 is selected from integers of 1 to 5. According to the exemplary embodiment, at least one of the xe11 $Ar_{601}$ and the xe21 $R_{601}$ may include a π electron-deficient nitrogen-containing ring as described above.

The electron injection layer of the electron transporting layer 50 may have i) a single-layered structure with a single layer made of a single material, ii) a single-layered structure with a single layer made of a plurality of different materials, or iii) a multi-layered structure with a plurality of layers made of a plurality of different materials.

The electron injection layer may include a reductive dopant. The reductive dopant may include at least one of an alkali metal, an alkaline earth metal, a rare earth metal, an alkali metal compound, an alkaline earth metal compound, a rare earth metal compound, an alkali metal complex, an alkaline earth metal complex, and a rare earth metal complex.

The alkali metal may be selected from Na, K, Rb, and Cs. In an implementation, the alkali metal may be, e.g., K, Rb, or Cs. In an implementation, the alkali metal may be, e.g., Rb or Cs.

The alkaline earth metal may be selected from Ca, Sr, and Ba. The rare earth metal may be selected from Sc, Y, Ce, Tb, Yb, Gd, and Tb. In an implementation, the alkali metal compound, the alkaline earth metal compound, and the rare earth metal compound may be selected from oxides and halides (e.g., fluorides, chlorides, bromides, iodides, etc.) of the alkali metal, the alkaline earth metal, and the rare earth metal.

In an implementation, the alkali metal compound may be selected from, e.g., an alkali metal oxide such as $Li_2O$, $Cs_2O$, $K_2O$, etc., and an alkali metal halide such as LiF, NaF, CsF, KF, LiI, NaI, CsI, KI, RbI, etc. In an implementation, the alkali metal compound may include, e.g., LiF, $Li_2O$, NaF, LiI, NaI, CsI, KI, or RbI.

In an implementation, the alkaline earth metal compound may be selected from alkaline earth metal compounds such as BaO, SrO, CaO, $Ba_xSr_{1-x}O$ (0<x<1), $Ba_xCa_{1-x}O$ (0<x<1), etc. In an implementation, the alkaline earth metal compound may include, e.g., BaO, SrO, or CaO.

In an implementation, the rare earth metal compound may be selected from $YbF_3$, $ScF_3$, $ScO_3$, $Y_2O_3$, $Ce_2O_3$, $GdF_3$, and $TbF_3$. In an implementation, the rare earth metal compound may include, e.g., $YbF_3$, $ScF_3$, $TbF_3$, $YbI_3$, $ScI_3$, or $TbI_3$.

In an implementation, the alkali metal complex, the alkaline earth metal complex, and the rare earth metal complex may include ions of the alkali metal, the alkaline earth metal, and the rare earth metal as described above, and each of ligands coordinated to the metal ions of the alkali metal complex, the alkaline earth metal complex, and the rare earth metal complex may be independently selected from, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxyphenylbenzoimidazole, hydroxyphenylbenzothiazole, bipyridine, phenanthroline, and cyclopentadiene.

In an implementation, the electron injection layer may be formed of only the reductive dopant as described above, or may further include an organic material in addition to the reductive dopant. When the electron injection layer includes the reductive dopant and the organic material, the reductive dopant may be uniformly or non-uniformly dispersed in a matrix made of the organic material.

The following Examples are provided in order to highlight characteristics of one or more embodiments, but it will be understood that the Examples are not to be construed as limiting the scope of the embodiments. Further, it will be understood that the embodiments are not limited to the particular details described in the Examples.

Hereinafter, effects of the light emitting diode according to the exemplary embodiment will be described with reference to specific exemplary embodiments. Table 1 shows wavelengths emitted by different host and dopant materials. Referring to Table 1, it may be seen that when $CaI_2$ is used as a host of the emission layer and Eu is used as a dopant of the emission layer, light having a central wavelength of 465 nm is emitted, and when $SrI_2$ is used as a host of the emission layer and Eu is used as a dopant of the emission layer, light having a central wavelength of 431 nm is emitted.

TABLE 1

| Host | Dopant | Wavelength | Quantum Yield | External Quantum Efficiency |
|---|---|---|---|---|
| $CaI_2$ | Eu | 465 nm | 10 | 1 |
| $SrI_2$ | Eu | 431 nm | 15 | 1.2 |

Figure 4:
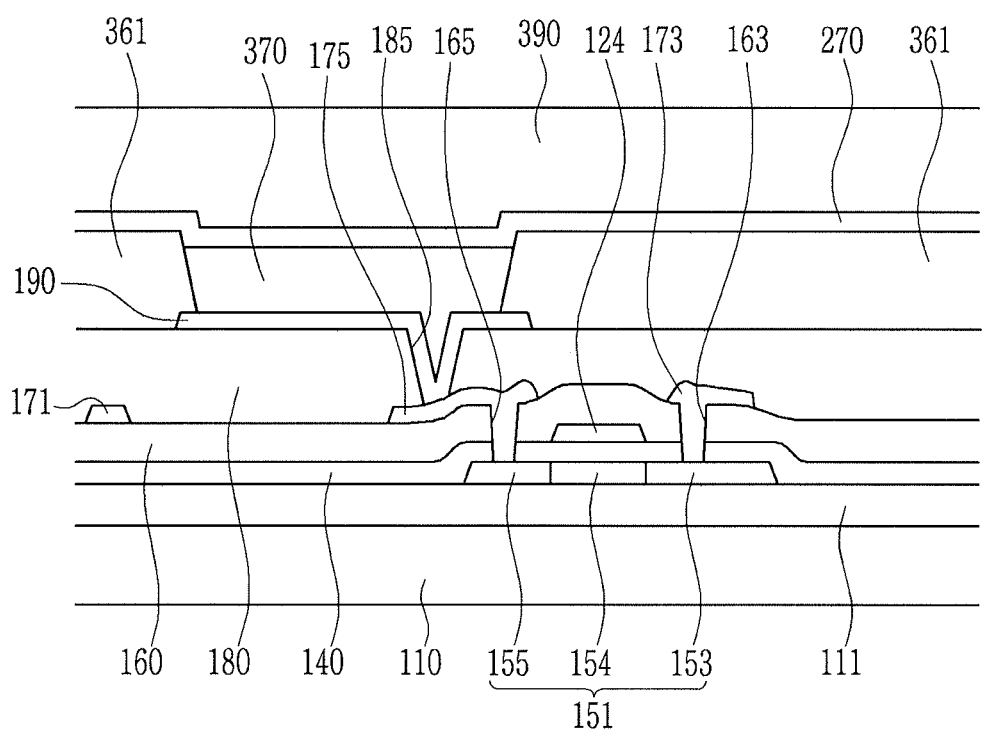
FIG. 4 illustrates a cross-sectional view of a display device according to an exemplary embodiment.

Hereinafter, a display device according to an exemplary embodiment will be described with reference to FIG. 4. FIG. 4 illustrates a cross-sectional view of a display device according to an exemplary embodiment.

Referring to FIG. 4, a buffer layer 111 made of a silicon oxide or a silicon nitride may be positioned on a substrate 110.

A semiconductor layer 151 may be positioned on the buffer layer 111. The semiconductor layer 151 may include a source region 153 and a drain region 155 doped with a p-type impurity, and a channel region 154 positioned between the source region 153 and the drain region 155.

A gate insulating layer 140 may be positioned on the semiconductor layer 151 and the buffer layer 111, and may include a silicon oxide or a silicon nitride. A control electrode 124 may overlap the channel region 154 of the semiconductor layer 151, and may be positioned on the gate insulating layer 140.

An interlayer insulating layer 160 may be positioned on the control electrode 124 and the gate insulating layer 140. The interlayer insulating layer 160 may be provided with a first contact hole 165 and a second contact hole 163.

A data conductor including a data line 171, an input electrode 173, and an output electrode 175 may be positioned on the interlayer insulating layer 160.

The output electrode 175 may be connected to the drain region 155 through the first contact hole 165. In addition, the input electrode 173 may be connected to the source region 153 through the second contact hole 163.

A passivation layer 180 may be positioned on the data conductors 171, 173, and 175 and the interlayer insulating layer 160, and may be provided with a contact hole 185.

A pixel electrode 190 may be positioned on the passivation layer 180. The pixel electrode 190 may be connected to the output electrode 175 through the contact hole 185. A partition wall 361 may be positioned on the passivation layer 180. A light emitting diode layer 370 may be positioned to overlap the pixel electrode 190, and a common electrode 270 may be positioned to overlap the light emitting diode layer 370. The light emitting diode may include the pixel electrode 190, the light emitting diode layer 370, and the common electrode 270.

In this case, the pixel electrode 190 may be an anode which is a hole injection electrode, and corresponds to the first electrode 10 described with reference to FIG. 1 to FIG. 3, while the common electrode 270 may be a cathode which is an electron injection electrode, and corresponds to the second electrode 20 described with reference to FIG. 1 to FIG. 3. In an implementation, according to a driving method of the display device, the pixel electrode 190 may be a cathode and the common electrode 270 may be an anode.

The light emitting diode layer 370 may include the emission layer 30 described with reference to FIG. 1, or may include the emission layer 30, the electron transporting layer 50, the hole transporting layer 40, etc. described with reference to FIG. 3.

An encapsulation layer 390 may be positioned to overlap the common electrode 270. The encapsulation layer 390 may include an organic material or an inorganic material, or may include the organic material and the inorganic material that are alternately stacked. The encapsulation layer 390 may help protect the display device from external moisture, heat, and other pollutants.

The structure of the described display device is one example, and the light emitting diode according to the exemplary embodiment of the present disclosure may be applied to a display device having a different structure.

By way of summation and review, an organic material may be used as an emission layer of the light emitting diode. However, the organic material may easily deteriorate in a high temperature and moisture environment, and stability of blue phosphorescence thereof may be poor.

The embodiments may provide a light emitting diode including an inorganic emission layer.

The embodiments may provide a light emitting diode and a display device including the same that may improve light emitting efficiency.

According to the embodiments, by including an inorganic emission layer resistant to temperature and moisture, it is possible to improve a lifespan and light emitting efficiency, and enable surface light emitting.

| <Description of symbols> | |
|---|---|
| 10: first electrode | 20: second electrode |
| 30: emission layer | 40: hole transporting layer |
| 50: electron transporting layer | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode, comprising:
a first electrode;
a second electrode overlapping the first electrode; and
an emission layer positioned between the first electrode and the second electrode,
wherein the emission layer includes:
a first material, the first material including an alkali metal iodide, an alkaline earth metal iodide, a transition metal iodide, an alkali metal chalcogenide, or an alkaline earth metal chalcogenide, and
a second material, the second material including a lanthanide metal or a compound of a lanthanide metal.

2. The light emitting diode as claimed in claim 1, wherein the first material includes LiI, NaI, KI, RbI, CsI, FrI, BeI$_2$, MgI$_2$, CaI$_2$, SrI$_2$, BaI$_2$, RaI$_2$, MgCII, CaCII, BaCII, SrCII, RaCII, MgBrI, CaBrI, BaBrI, SrBrI, RaBrI, Li$_2$S, Na$_2$S, K$_2$S, Rb$_2$S, Cs$_2$S, Fr$_2$S, Li$_2$Se, Na$_2$Se, K$_2$Se, Rb$_2$Se, Cs$_2$Se, Fr$_2$Se, Li$_2$Te, Na$_2$Te, K$_2$Te, Rb$_2$Te, Cs$_2$Te, Fr$_2$Te, MgS, CaS, BaS, SrS, RaS, MgSe, CaSe, BaSe, SrSe, RaSe, MgTe, CaTe, BaTe, SrTe, or RaTe.

3. The light emitting diode as claimed in claim 1, wherein:
the second material includes the compound of the lanthanide metal, and
the compound of the lanthanide metal is a compound that includes:
La, Ce, Pr, Nd, Pm, Sm, Eu, Gd, Tb, Dy, Ho, Er, Tm, Yb, or Lu, and
O, S, Se, Te, F, Cl, Br, or I.

4. The light emitting diode as claimed in claim 1, wherein a content ratio of the first material to the second material of the emission layer is 5:5 to 9.9:0.1.

5. The light emitting diode as claimed in claim 1, wherein the emission layer includes a third material formed by reacting the first material and the second material.

6. The light emitting diode as claimed in claim 5, wherein:
the third material is denoted by $A_mB_nC_z$,
A is an alkali metal,
B is a lanthanide metal or an alkaline earth metal,
C is an iodine, and
each of m, n, and z is an integer of 1 to 9.

7. The light emitting diode as claimed in claim 1, wherein the emission layer includes:
CsI, RbI, KI, NaI, CaI$_2$, or SrI$_2$, and
Eu, Yb, or Sm, and
a central wavelength emitted from the emission layer is 410 nm to 800 nm.

8. The light emitting diode as claimed in claim 1, wherein the emission layer does not include cadmium or lead.

9. The light emitting diode as claimed in claim 1, further comprising a hole transporting layer positioned between the first electrode and the emission layer,
wherein the hole transporting layer includes an alkali metal halide or an alkaline earth metal halide.

10. The light emitting diode as claimed in claim 1, further comprising an electron transporting layer positioned between the second electrode and the emission layer,
wherein the electron transporting layer includes:
an alkali metal halide or an alkaline earth metal halide, and
a lanthanide metal.

11. A light emitting diode, comprising:
a first electrode;
a second electrode overlapping the first electrode; and
an emission layer positioned between the first electrode and the second electrode,
wherein:
the emission layer includes a host and a dopant,
the host includes an alkali metal iodide, an alkaline earth metal iodide, a transition metal iodide, an alkali metal chalcogenide, or an alkaline earth metal chalcogenide, and
the dopant includes a lanthanide metal or a compound of a lanthanide metal.

12. The light emitting diode as claimed in claim 11, wherein a content ratio of the host to the dopant of the emission layer is 5:5 to 9.9:0.1.

13. The light emitting diode as claimed in claim 11, wherein the host includes LiI, NaI, KI, RbI, CsI, FrI, BeI$_2$, MgI$_2$, CaI$_2$, SrI$_2$, BaI$_2$, RaI$_2$, MgCII, CaCII, BaCII, SrCII, RaCII, MgBrI, CaBrI, BaBrI, SrBrI, RaBrI, Li$_2$S, Na$_2$S, K$_2$S, Rb$_2$S, Cs$_2$S, Fr$_2$S, Li$_2$Se, Na$_2$Se, K$_2$Se, Rb$_2$Se, Cs$_2$Se, Fr$_2$Se, Li$_2$Te, Na$_2$Te, K$_2$Te, Rb$_2$Te, Cs$_2$Te, Fr$_2$Te, MgS, CaS, BaS, SrS, RaS, MgSe, CaSe, BaSe, SrSe, RaSe, MgTe, CaTe, BaTe, SrTe, or RaTe.

14. The light emitting diode as claimed in claim 11, wherein:
the dopant includes the compound of the lanthanide metal, and the compound of the lanthanide metal is a compound that includes:
La, Ce, Pr, Nd, Pm, Sm, Eu, Gd, Tb, Dy, Ho, Er, Tm, Yb, or Lu, and
O, S, Se, Te, F, Cl, Br, or I.

15. The light emitting diode as claimed in claim 11, wherein
the host includes CsI, RbI, KI, NaI, $CaI_2$, or $SrI_2$,
the dopant includes Eu, Yb, or Sm, and
a central wavelength emitted from the emission layer is 410 nm to 800 nm.

16. A display device, comprising:
a substrate;
a thin film transistor positioned on the substrate; and
a light emitting diode connected to the thin film transistor, wherein the light emitting diode includes a first electrode,
a second electrode overlapping the first electrode, and
an emission layer positioned between the first electrode and the second electrode,
wherein the emission layer includes:
an alkali metal iodide, an alkaline earth metal iodide, a transition metal iodide, an alkali metal chalcogenide, or an alkaline earth metal chalcogenide, and
a lanthanide metal or a compound of a lanthanide metal, and wherein the emission layer does not include an organic material.

17. The display device as claimed in claim 16, wherein:
the emission layer includes the alkali metal iodide or the alkaline earth metal iodide, and
the alkali metal iodide or the alkaline earth metal iodide includes LiI, NaI, KI, RbI, CsI, FrI, $BeI_2$, $MgI_2$, $CaI_2$, $SrI_2$, $BaI_2$, $RaI_2$, $MgCl_2$, $CaCl_2$, $BaCl_2$, $SrCl_2$, $RaCl_2$, $MgBrI$, $CaBrI$, $BaBrI$, $SrBrI$, $RaBrI$, $Li_2S$, $Na_2S$, $K_2S$, $Rb_2S$, $Cs_2S$, $Fr_2S$, $Li_2Se$, $Na_2Se$, $K_2Se$, $Rb_2Se$, $Cs_2Se$, $Fr_2Se$, $Li_2Te$, $Na_2Te$, $K_2Te$, $Rb_2Te$, $Cs_2Te$, $Fr_2Te$, MgS, CaS, BaS, SrS, RaS, MgSe, CaSe, BaSe, SrSe, RaSe, MgTe, CaTe, BaTe, SrTe, or RaTe.

18. The display device as claimed in claim 16, wherein:
the emission layer includes the compound of the lanthanide metal, and
the compound of the lanthanide metal is a compound that includes:
La, Ce, Pr, Nd, Pm, Sm, Eu, Gd, Tb, Dy, Ho, Er, Tm, Yb, or Lu, and
O, S, Se, Te, F, Cl, Br, or I.

19. The display device as claimed in claim 16, wherein
the alkali metal iodide, the alkaline earth metal iodide, the transition metal iodide, the alkali metal chalcogenide, or the alkaline earth metal chalcogenide is a host of the emission layer,
the lanthanide metal or the compound of a lanthanide metal is a dopant of the emission layer,
the host includes CsI, RbI, KI, NaI, $CaI_2$, or $SrI_2$,
the dopant includes Eu, Yb, or Sm, and
a central wavelength emitted from the emission layer is 410 nm to 800 nm.

20. The display device as claimed in claim 16, wherein a content ratio of the alkali metal iodide, the alkaline earth metal iodide, the transition metal iodide, the alkali metal chalcogenide, and the alkaline or metal chalcogenide to the lanthanide metal or the compound of a lanthanide metal is 5:5 to 9.9:0.1.

21. The display device as claimed in claim 16, wherein:
the alkali metal iodide, the alkaline earth metal iodide, the transition metal iodide, the alkali metal chalcogenide, or the alkaline earth metal chalcogenide is a host of the emission layer, and
the lanthanide metal or the compound of a lanthanide metal is a dopant of the emission layer.

22. The display device as claimed in claim 16, wherein:
the emission layer includes a material denoted by $A_mB_nC_z$,
A is an alkali metal,
B is a lanthanide metal or an alkaline earth metal,
C is an iodine, and
each of m, n, and z is an integer of 1 to 9.

23. The display device as claimed in claim 16, wherein the emission layer does not include cadmium or lead.

* * * * *